US008935117B2

(12) United States Patent
Tercariol et al.

(10) Patent No.: US 8,935,117 B2
(45) Date of Patent: Jan. 13, 2015

(54) CIRCUIT AND METHOD FOR MEASURING VOLTAGE

(75) Inventors: Walter Luis Tercariol, Campinas (BR); Richard T. L. Saez, Campinas (BR); Fernando Zampronho Neto, Jacarei (BR); Ivan Carlos Ribeiro Nascimento, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 498 days.

(21) Appl. No.: 13/416,892

(22) Filed: Mar. 9, 2012

(65) Prior Publication Data

US 2013/0238273 A1 Sep. 12, 2013

(51) Int. Cl.
| | |
|---|---|
| G06F 19/00 | (2011.01) |
| G01R 31/00 | (2006.01) |
| G01R 31/28 | (2006.01) |
| G01R 19/00 | (2006.01) |
| G01R 31/26 | (2014.01) |
| G01R 31/3185 | (2006.01) |
| H01L 29/78 | (2006.01) |
| H01L 29/417 | (2006.01) |
| H03K 17/082 | (2006.01) |

(52) U.S. Cl.
CPC ........ *G01R 31/2884* (2013.01); *G01R 19/0084* (2013.01); *G01R 31/2621* (2013.01); *G01R 31/318511* (2013.01); *H01L 29/7803* (2013.01); *H01L 29/7808* (2013.01); *H01L 29/7804* (2013.01); *H01L 29/41766* (2013.01); *H01L 29/7815* (2013.01); *H03K 17/0822* (2013.01)
USPC .................. 702/117; 365/185.2; 365/185.21; 365/185.23; 365/201; 365/189.06; 374/185; 374/E0.018; 327/543

(58) Field of Classification Search
CPC ............... G01R 31/2884; G01R 31/318511; G01R 19/0084; G01R 31/2621; H01L 29/7803; H01L 29/7808; H01L 29/7815; H01L 29/7804; H01L 29/41766; H03K 17/0822
USPC ............. 702/117; 365/185.2, 185.21, 185.23, 365/201, 189.06; 374/185, E0.018; 327/543
See application file for complete search history.

(56) References Cited

U.S. PATENT DOCUMENTS

| | | | | |
|---|---|---|---|---|
| 3,912,947 | A * | 10/1975 | Buchanan | 326/57 |
| 3,956,708 | A * | 5/1976 | Musa | 330/253 |
| 4,789,825 | A * | 12/1988 | Carelli et al. | 324/750.3 |
| 5,617,370 | A * | 4/1997 | Ishikawa | 365/185.17 |
| 5,801,573 | A * | 9/1998 | Kelly et al. | 327/434 |
| 6,165,131 | A | 12/2000 | Cuce' et al. | |
| 7,108,424 | B2 | 9/2006 | Heumann et al. | |
| 7,193,912 | B2 * | 3/2007 | Obara et al. | 365/203 |
| 7,336,540 | B2 | 2/2008 | Ng et al. | |
| 7,433,253 | B2 * | 10/2008 | Gogl et al. | 365/209 |
| 7,751,248 | B2 | 7/2010 | Ng et al. | |

(Continued)

*Primary Examiner* — Carol S Tsai

(57) ABSTRACT

A testing circuit in an integrated circuit indirectly measures a voltage at a node of other circuitry in the integrated circuit. The testing circuit includes a transistor having a control electrode, a first conducting electrode coupled to a first pad, a second conducting electrode coupled to a terminal of a power supply, and one or more switches for selectively coupling the control electrode to one of the node and a second pad. A method includes determining a relationship between drain current and gate voltage of the transistor when the control electrode is coupled to the second pad. A voltage at the node is determined by relating the current through the first conducting electrode of the transistor when control electrode is coupled to the node.

20 Claims, 2 Drawing Sheets

(56) References Cited

U.S. PATENT DOCUMENTS

| | | |
|---|---|---|
| 8,083,404 B2 * | 12/2011 | Shoda ........................... 374/170 |
| 2007/0159901 A1 * | 7/2007 | Obara et al. ................... 365/203 |
| 2007/0237013 A1 | 10/2007 | Ng et al. |
| 2008/0002481 A1 * | 1/2008 | Gogl et al. ............... 365/189.06 |
| 2008/0144386 A1 | 6/2008 | Ng et al. |
| 2009/0059999 A1 * | 3/2009 | Shoda ........................... 374/185 |
| 2010/0295567 A1 * | 11/2010 | Chang ........................... 324/719 |
| 2010/0318313 A1 * | 12/2010 | Agarwal et al. ................ 702/117 |
| 2010/0327961 A1 * | 12/2010 | Ikenaga et al. ................ 327/540 |

* cited by examiner

CIRCUIT AND METHOD FOR MEASURING VOLTAGE

BACKGROUND OF THE INVENTION

1. Field of the Invention

This invention relates generally to circuits and methods for measuring a voltage, and more specifically to a circuit and method for measuring a voltage within an integrated circuit.

2. Related Art

Most known circuits and methods for measuring a voltage that exists within an integrated circuit either directly measure the voltage being measured or measure another voltage that is related in some way to the voltage being measured.

Known circuits and methods for testing a voltage that normally exists solely within a packaged integrated circuit, such as an output voltage of a charge pump, typically use one or more test pads that are disposed on a die of the integrated circuit. Switches, controlled by testing logic, are typically used to couple an output terminal of the charge pump to one of the test pads. As a result, the output voltage of the charge pump appears at such test pad. Then, the output voltage is directly measured using testing instrumentation that is located outside of the integrated circuit and coupled to such test pad.

A test pad usually has structures to protect circuitry within the integrated circuit from electrostatic discharge (ESD). An ESD protection structure of a low-voltage test pad usually includes a diode coupled between the test pad and a power supply voltage $V_{DD}$ of the integrated circuit. Because the output voltage of a charge pump is usually higher than $V_{DD}$, known methods cannot use a low-voltage test pad to directly measure the output voltage of a charge pump. Instead, known methods disadvantageously require that a high-voltage test pad be used. A high-voltage test pad is a test pad capable of tolerating voltages higher than $V_{DD}$. The ESD protection structure of a high-voltage test pad includes a zener diode coupled between the high-voltage test pad and a voltage source that provides a voltage at least as high as the output voltage of the charge pump. A high-voltage test pad occupies a larger area than a low-voltage test pad because a high-voltage test pad requires a greater amount of isolation from other circuitry within the integrated circuit. Also, zener diodes associated with a high-voltage test pad occupy a larger area than diodes associated with a low-voltage test pad. A high-voltage test pad disadvantageously has a greater amount of leakage current than a low-voltage test pad.

One known method of measuring the output voltage of a charge pump disposed within an integrated circuit is to use a switch to couple an output terminal of the charge pump to a test pad at which the output voltage is directly measured. This method requires a high-voltage test pad, rather than a low-voltage test pad, because the relatively high output voltage of the charge pump appears at the test pad. Because of the large amount of current leakage that is inherent in a high-voltage test pad, this method is typically limited to testing a charge pump that has high output current capability, e.g., about 100 µA. When this method is used for testing a charge pump that has low output current capability, e.g., about 10 µA, the measurement of the output voltage is likely to be inaccurate because the leakage current may constitute a large portion of the total output current capacity of the low current output charge pump.

Another known method of measuring the output voltage of a charge pump disposed within an integrated circuit is to use a converter, which is circuitry coupled between an output terminal of the charge pump and a test pad. The converter changes the output voltage of the charge pump to a lower voltage and the lower voltage is directly measured at the test pad. The converter comprises several components, and, therefore, occupies a large area. Also, the converter disadvantageously draws current from the charge pump, which may adversely affect measurement of the output voltage of the charge pump.

Another known method of measuring the output voltage of a charge pump disposed on an integrated circuit is to use an operational transconductance amplifier (OTA) that acts as a buffer between the output of a low output current capacity charge pump and a test pad at which a voltage outputted by the buffer is directly measured. The OTA has a higher output current capacity than the low output current capacity charge pump. The OTA typically outputs a voltage equal to the output voltage of the charge pump; therefore, this method requires a high-voltage test pad, rather than a low-voltage test pad. Disadvantageously, the OTA comprises more than one transistor; the OTA suffers from a voltage offset problem may adversely affect measurement of the output voltage of the charge pump; and there is a need to compensate for a feedback loop around the OTA.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE EXEMPLARY EMBODIMENT

Figure 1:
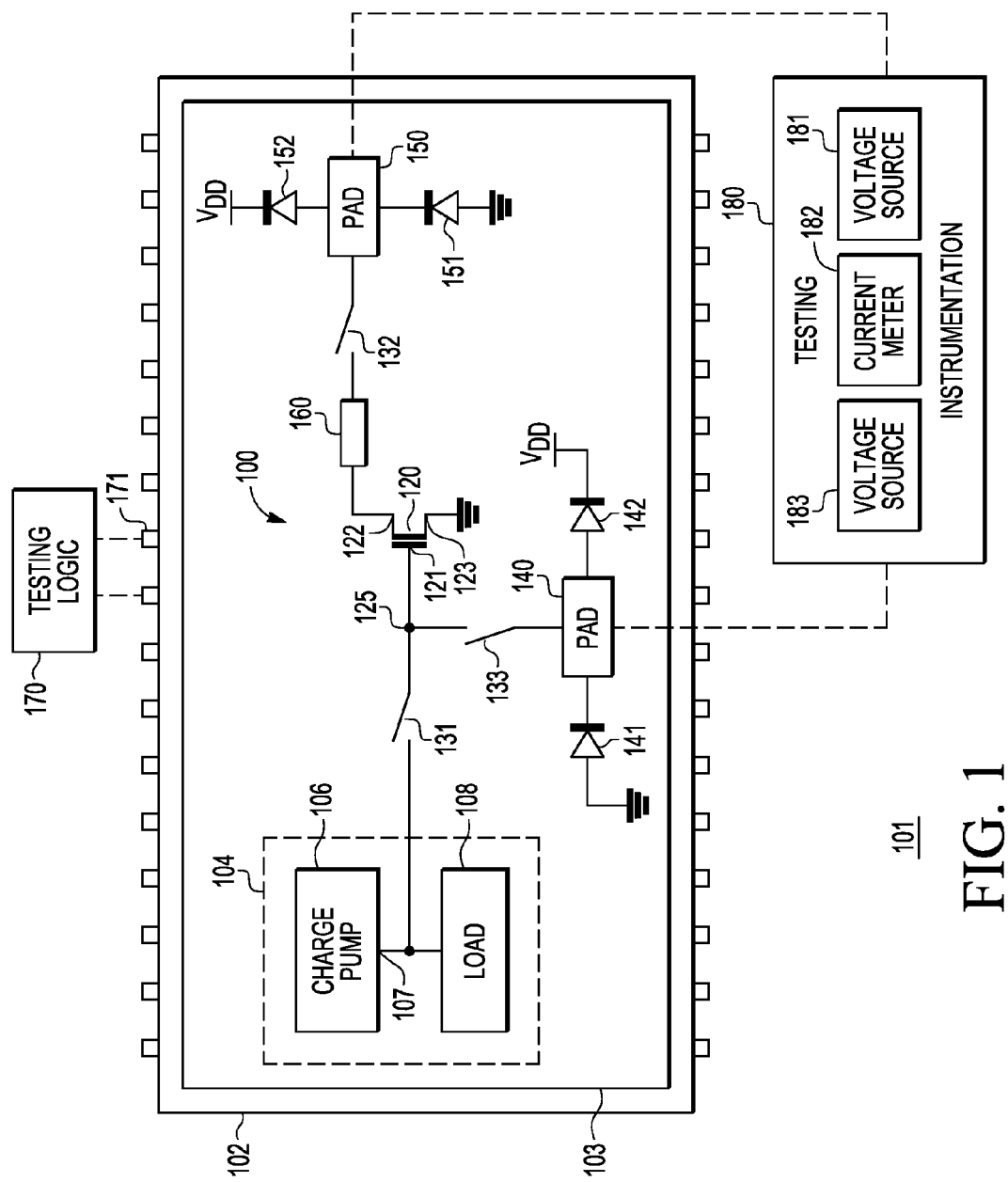
FIG. 1 illustrates a testing system including one embodiment of a simplified functional block diagram and schematic of a testing circuit, which includes a transconductance converter device such as a transistor.

FIG. 1 illustrates a testing system 101, including one embodiment of a simplified functional block diagram and schematic of a testing circuit 100 in accordance with the invention. The testing circuit 100 is disposed within an integrated circuit 102. Also disposed within the integrated circuit 102 is a device under test (DUT) 104. In one embodiment, the DUT 104 is a charge pump 106 that has an output terminal 107 coupled to a load 108. In one embodiment, the charge pump 106 has low output current capability, e.g., about 10 µA. Typically, an output voltage of the charge pump 106 is higher than a voltage $V_{DD}$ of a power supply (not shown) used for other circuitry (not shown) within the integrated circuit 102. In one embodiment, $V_{DD}$=3V. In one embodiment, the load 108 is a flash memory. In one embodiment, the output voltage of the charge pump 106 is used for reading bitcells of the flash memory. In one embodiment of the charge pump 106, an input voltage of the charge pump is 3V and, in such embodiment, the output voltage of the charge pump is ideally 6V. However, in an actual implementation of such embodiment of the charge pump 106, when the input voltage of the charge pump is 3V, the output voltage of the charge pump may be less than 6V.

The testing circuit 100 and method in accordance with the invention determine a value of a voltage at a node of other circuitry within the integrated circuit 102 without directly measuring the voltage at the node. In one embodiment, the node of the other circuitry is the output terminal 107 of the charge pump 106. In one embodiment, the testing circuit 100 and method in accordance with the invention measure a current that is related to the output voltage of the charge pump 106. In such one embodiment, the testing circuit 100 and method in accordance with the invention does not directly measure the output voltage of the charge pump 106.

The testing circuit 100 comprises a transconductance converter device. In one embodiment, the testing circuit comprises a single transconductance converter device, which allows the testing circuit to occupy only a small area of a die, or circuit-supporting substrate 103, of the integrated circuit 102. In one embodiment, the single transconductance converter device is a transistor 120. A control electrode 121 of transistor 120 is coupled to a node 125. The node 125 is coupleable to the output terminal 107 of the charge pump 106 by a switch 131. The node 125 is also coupleable to a test pad (hereinafter "pad") 140 by a switch 133. A pad is a metallic member disposed near the surface of a die of an integrated circuit, in which a portion of a passivation layer of the die has been removed above the pad so that a probe needle can make direct contact with the pad. In one embodiment, a pad has a size of approximately 10 µm by 10 µm. One conducting electrode 122 of transistor 120 is coupleable to pad 150 by a switch 132. Another conducting electrode 123 of transistor 120 is coupled to a terminal of the power supply. In one embodiment, transistor 120 is an n-channel metal-oxide-semiconductor field-effect transistor (hereinafter "MOSFET") in which control electrode 121 is a gate terminal of the transistor, conducting electrode 122 is a drain terminal of the transistor, and conducting electrode 123 is a source terminal of the transistor which is coupled to a ground potential terminal of the power supply.

An internal resistance $R_{INT}$ 160 exists between conducting electrode 122 and pad 150. $R_{INT}$ 160 represents a resistance in the integrated circuit 102 in a circuit path between the drain of transistor 120 and pad 150. $R_{INT}$ includes a parasitic resistance of about 100Ω, depending on the fabrication technology of the integrated circuit 102. In one embodiment, $R_{INT}$ 160 is increased up to several thousand ohms, depending on the fabrication technology of the integrated circuit 102, to help maintain transistor 120 operating in a saturation region. However, in another embodiment, $R_{INT}$ 160 is not increased beyond its parasitic value, and, instead, a resistance (not shown) is added, outside of the integrated circuit 102, between pad 150 and the voltage source 181.

To protect circuitry within the integrated circuit 102 from electrostatic discharge (ESD) emanating from pad 140, a diode 141 is coupled between the pad and a ground terminal, and a diode 142 is coupled between the pad and the $V_{DD}$ terminal of the power supply. For a corresponding reason, a diode 151 is coupled between pad 150 and a ground terminal, and a diode 152 is coupled between pad 150 and the $V_{DD}$ terminal of the power supply. Because the diodes 142 and 152 are coupled to $V_{DD}$ (and not to a voltage source higher than $V_{DD}$), pads 140 and 150 advantageously may be low-voltage pads that occupy less area than high-voltage pads.

In one embodiment, transistor 120 is biased to operate in the saturation region so that a drain current $I_{DRAIN}$ through the transistor depends almost entirely on, and is directly proportional to, a square of a gate-to-source voltage ($V_{GS}$) of the transistor, i.e., the transistor has a quadratic relationship between $V_{GS}$ and $I_{DRAIN}$. Therefore, the relationship $\sqrt{I_{DRAIN}}$ versus $V_{GS}$ is linear when transistor 120 is operating in the saturation region. The test circuit 100 and method uses the relationship $\sqrt{I_{DRAIN}}$ versus $V_{GS}$ to indirectly determine the output voltage of the charge pump 106. Transistor 120 is kept in the saturation region by biasing it with a high enough drain-to-source voltage ($V_{DS}$). In one embodiment, transistor 120 has a channel length (L) that is much greater than a channel width (W) in order to guarantee a weak current transconductance. To avoid power dissipation, the channel of transistor 120 has an L>>W relationship such that current through the transistor is limited to less than about 100 µA in one embodiment.

The integrated circuit 102 has a functional mode and a test mode. When the integrated circuit 102 is in the functional mode, switch 131 is open; therefore, the DUT 104 is not coupled to the testing circuit 100. When the integrated circuit 102 is in the functional mode, switches 132 and 133 may also be open. When the integrated circuit 102 is in the functional mode, the testing circuit 100 and the pads 140 and 150 are not used or needed for operation of the DUT 104. The testing circuit 100 and method in accordance with the invention is used when the integrated circuit 102 is in the test mode. The testing method comprises opening and closing switches 131 and 133 at different non-overlapping occasions. The opening and closing of switches 131 and 133 are controlled by signals from testing logic 170 that is coupled to one or more pins 171 of the integrated circuit 102. At no time are switches 131 and 133 both closed. While the testing circuit 100 is being used, switch 132 remains closed. Switch 132 is also controlled by the testing logic 170. Switch 132 is opened when the testing circuit 100 is not being used, and if pad 150 is to be coupled to another circuit (not shown) by the testing logic 170. The testing method includes a calibration phase followed by a measurement phase.

During the calibration phase, switches 132 and 133 are maintained in a closed position and switch 131 is maintained in an open position. Switch 132 is closed so that a drain current $I_{DRAIN}$ of transistor 120 can be measured by testing instrumentation 180, located outside the integrated circuit 102, when a probe needle, which is coupled to the testing instrumentation, touches pad 150. Switch 133 is closed so that $V_2$ voltages, which are applied to pad 140, by the testing instrumentation 180 in one embodiment, can be coupled to the gate of transistor 120. Switch 131 is open to isolate the DUT 104 from the testing circuit 100. The testing instrumentation 180 may include a first voltage source 181 for supplying a constant voltage $V_1$ that is applied to pad 150, a current meter 182 for measuring the drain current $I_{DRAIN}$ of transistor 120, and a second voltage source 183 for supplying the voltages $V_2$ that are applied to pad 140.

During the calibration phase, physical characteristics of transistor 120 are determined. The physical characteristics include a relationship between drain current and gate voltage for more than one gate voltage. The calibration phase includes at least a first step and a second step. During the calibration phase, the constant voltage $V_1$ is applied to pad 150, thereby providing a $V_{DS}$ of transistor 120. The constant voltage $V_1$ may originate from the testing instrumentation 180. In another embodiment (not shown), $V_1$ is a known voltage obtained from within the integrated circuit 102. In the one embodiment in which $V_{DD}=3V$, a value of 2V may be chosen for $V_1$, for example. Note, in this example, that $V_1<V_{DD}$; therefore, pad 150 may advantageously be a low-voltage pad. In the calibration phase, appropriate values of $V_{GS1}$ and $V_{GS2}$ are selected, which will be used as calibration voltages. In a first step of the calibration phase, a first calibration voltage $V_{GS1}$ is applied to pad 140. In one embodiment, as illustrated in FIG. 1, the first calibration voltage $V_{GS1}$ is obtained from the voltage source 183 of the testing instrumentation 180. In another embodiment (not shown), the first calibration voltage $V_{GS1}$ is a known voltage obtained from within the integrated circuit 102. The first calibration voltage $V_{GS1}$ is applied to the gate of transistor 120, and a resulting first calibration current $I_{DRAIN1}$ through the transistor is measured. Next, using a graphical method, a point $(V_{GS1}, \sqrt{I_{DRAIN1}})$ is plotted on a graph of $\sqrt{I_{DRAIN}}$ versus $V_{GS}$ (such as a graph similar to the graph of FIG. 2). In a second step of the calibration phase, a second calibration voltage $V_{GS2}$ is applied to the gate of transistor 120 and a resulting second calibration current $I_{DRAIN2}$ through the transistor is measured. In the one embodiment illustrated in FIG. 1, the second calibration voltage $V_{GS2}$ is also obtained from the voltage source 183. In another embodiment (not shown), the second calibration voltage $V_{GS2}$ is a known voltage obtained from within the integrated circuit 102. Next, using the graphical method, a point $(V_{GS2}, \sqrt{I_{DRAIN2}})$ is plotted on the graph of $\sqrt{I_{DRAIN}}$ versus $V_{GS}$.

During the measurement phase, switch 132 continues to be maintained in the closed position; switch 133 is opened and maintained in an open position, and then switch 131 is closed maintained in the closed position. Because switch 131 is closed and switch 133 is open, the output terminal 107 of the charge pump 106 is coupled to the gate of transistor 120. The output voltage of the charge pump 106 is assumed to be unknown at this juncture of the testing method; therefore, $V_{GS3}$ is unknown. At this juncture, a third drain current $I_{DRAIN3}$ flows through transistor 120, and $I_{DRAIN3}$ is measured using the current meter 182 of the testing instrumentation 180. Next, $\sqrt{I_{DRAIN3}}$ is calculated from $I_{DRAIN3}$. Because transistor 120 is biased to operate in the saturation region, gate-to-source voltages of the transistor, when plotted on the graph of $\sqrt{I_{DRAIN}}$ versus $V_{GS}$, lie on a straight line (such as the straight line 211 of FIG. 2) connecting the points $(V_{GS1}, \sqrt{I_{DRAIN1}})$ and $(V_{GS2}, \sqrt{I_{DRAIN2}})$. Therefore, from the measured current $I_{DRAIN3}$, an output voltage of the charge pump 106 is indirectly determined. In the graphical method, the output voltage of the charge pump 106 is graphically found from the intersection of a line representing $\sqrt{I_{DRAIN}} = \sqrt{I_{DRAIN3}}$ with the straight line connecting the points $(V_{GS1}, \sqrt{I_{DRAIN1}})$ and $(V_{GS2}, \sqrt{I_{DRAIN2}})$, without directly measuring the output voltage of the charge pump. In another method, the output voltage of the charge pump 106 is mathematically calculated using Equation (9) hereinbelow, without directly measuring the output voltage of the charge pump.

A second testing method that uses the testing circuit 100 is described hereinbelow. From known physical characteristics of transistor 120, the transistor is biased such that it operates in the saturation region. In an alternative measurement phase, switch 131 is initially closed; therefore, the output voltage of the charge pump 106 becomes $V_{GS}$ of transistor 120. Of course, at this juncture, the value of the output voltage of the charge pump 106 is not known, and, therefore, $V_{GS}$ is not known. In the second testing method, switch 133 is initially open; therefore, at this juncture, pad 140 is disconnected from the testing circuit 100. Switch 132 remains closed during all steps of the second testing method. Next, using the first voltage source 181 of the testing instrumentation 180, a voltage is applied to pad 150, which becomes $V_{DS}$ of transistor 120 because switch 132 is closed. Next, while such voltage is being applied to pad 150, a resulting current $I_{DRAIN4}$ through transistor 120 is measured using the current meter 182 of the testing instrumentation 180. Next, switch 131 is opened thereby disconnecting the charge pump 106 from the testing circuit 100, and switch 133 is closed thereby coupling pad 140 to the gate of transistor 120. Next, using the second voltage source 183 of the testing instrumentation 180, various values of the voltage are applied to pad 140, and for each value, a resulting current $I_{DRAIN5}$ through transistor 120 is measured using the current meter 182. The value of the voltage that is applied to pad 140 that results in $I_{DRAIN4}=I_{DRAIN5}$ is a same value as the output voltage of the charge pump 106. With the second testing method only, pad 140 may need to be a high-voltage pad.

Figure 2:
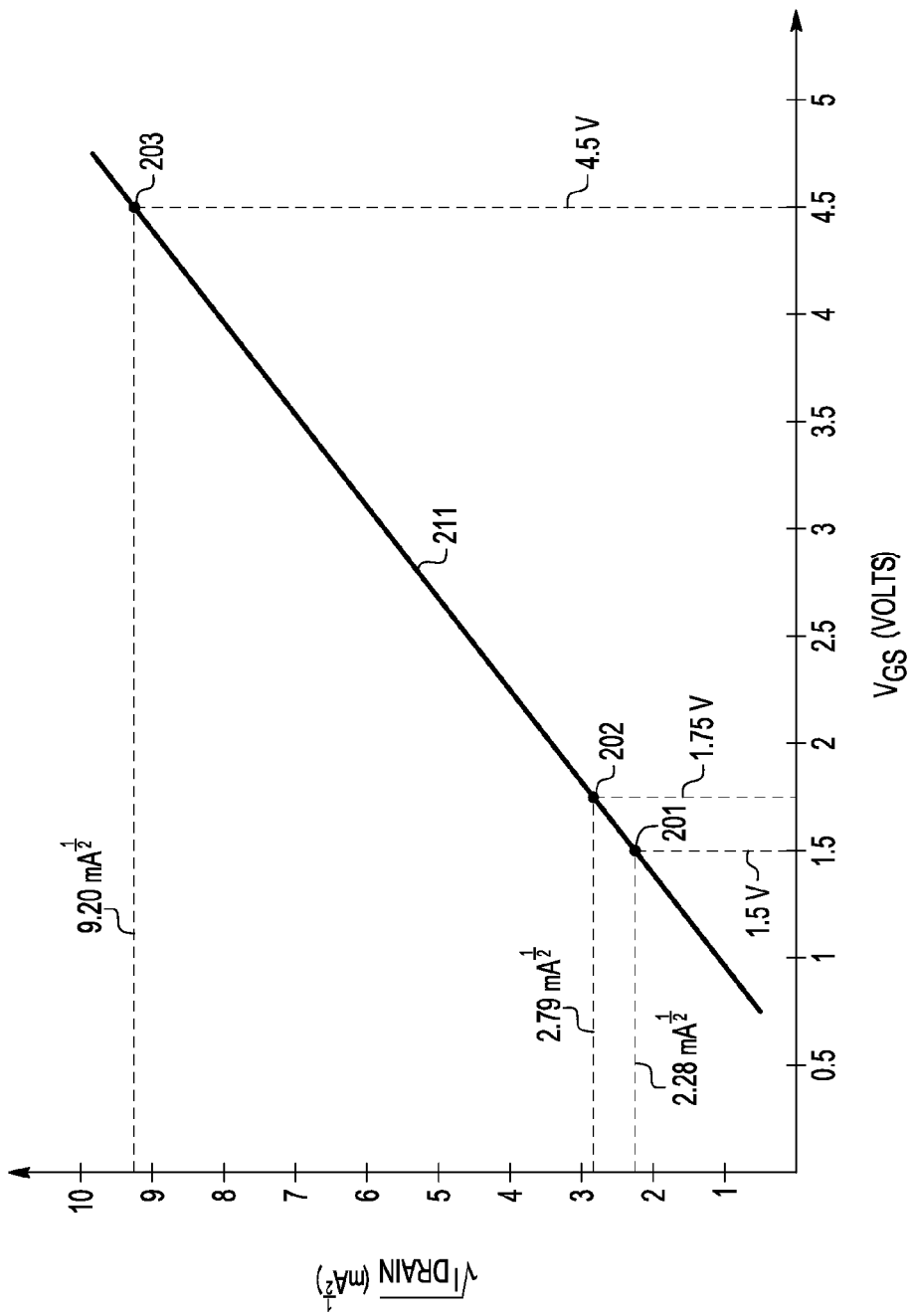
FIG. 2 is a graph of square root of drain current versus gate-to-source voltage of the transistor shown in FIG. 1, which illustrates results of a simulation of the testing circuit of FIG. 1.

FIG. 2 is a graph 200 of square root of drain current versus gate-to-source voltage of transistor 120 found during a simulation of the testing circuit 100. For example, in the one embodiment in which $V_{DD}=3V$, $V_{GS1}$ may be selected to be 1.5V and $V_{GS2}$ may be selected to be 1.75V. In such one embodiment, during the calibration phase, a resulting $I_{DRAIN1}$ is found to be 5.2 μA, and a resulting $I_{DRAIN2}$ is found to be 7.8 μA, respectively. Note that $\sqrt{I_{DRAIN1}}=2.28$ mA$^{1/2}$, and note that $\sqrt{I_{DRAIN2}}=2.79$ mA$^{1/2}$. In the same example, during the measurement phase, when the output voltage of the charge pump 106 is coupled to the gate of transistor 120, a resulting $I_{DRAIN3}$ is found to be 84.7 μA. A square root of 84.7 is 9.2. From the fact that $\sqrt{I_{DRAIN3}}=9.2$ mA$^{1/2}$, and by using the graph 200, it can be seen that $V_{GS3}$ is 4.5V. Alternatively, $V_{GS3}$ is mathematically calculated from $V_{GS1}$, $V_{GS2}$, $I_{DRAIN1}$, $I_{DRAIN2}$ and $I_{DRAIN3}$ using Equation (9) hereinbelow. Note that, in the one embodiment in which $V_{GS1}=1.5V$ and $V_{GS2}=1.75V$, $V_{GS1}<V_{DD}$ and $V_{GS1}<V_{DD}$; therefore, pad 140 may advantageously be a low-voltage pad. In the simulation, a third point 203 was extrapolated from two measured points 201 and 202 on the graph 200 to determine the output voltage of the charge pump 106, thereby indirectly measuring the output voltage of the charge pump. Because transistor 120 was biased to operate in the saturation region in the simulation, the extrapolation was advantageously linear, as illustrated by the straight line 211.

A precise measurement of $I_{DRAIN3}$ can be obtained when the values selected for $V_{GS1}$ and $V_{GS2}$ are each substantially less than the output voltage of the charge pump 106. In such case, a value for $I_{DRAIN3}$ is extrapolated from the values of $I_{DRAIN1}$ and $I_{DRAIN2}$. $V_{GS1}$ and $V_{GS2}$ are substantially enough less than the output voltage of the charge pump 106, then pad 140 can be a low-voltage pad. Therefore, the testing circuit 100 advantageously does not require any high-voltage pads.

A more precise measurement of $I_{DRAIN3}$ can be obtained when the output voltage of the charge pump 106 is between $V_{GS1}$ and $V_{GS2}$. This is accomplished by selecting a value for $V_{GS1}$ that is less than an expected output voltage of the charge pump 106 and a value for $V_{GS2}$ that is greater than the expected output voltage of the charge pump. In such case, a value for $I_{DRAIN3}$ is interpolated from the values of $I_{DRAIN1}$ and $I_{DRAIN2}$ that resulted from the selected values of $V_{GS1}$ and $V_{GS2}$, respectively. However, in such case, pad 140 is a high-voltage pad because the value selected for $V_{GS2}$ is greater than the expected output voltage of the charge pump 106. Therefore, in such case, diode 142 is a zener diode, and it is coupled between pad 140 and a voltage source (not shown) that is at least as high as the selected $V_{GS2}$.

Therefore, the testing circuit 100 and method in accordance with the invention rely on one of an extrapolation and an interpolation of a third point from two measured points on a graph of $\sqrt{I_{DRAIN}}$ versus $V_{GS}$ of transistor 120 to determine the output voltage of the charge pump 106, thereby indirectly measuring the output voltage of the charge pump.

To maintain transistor 120 operating in the saturation region, drain voltage must be greater than or equal to gate voltage minus threshold voltage $V_{Th}$. In one embodiment, transistor 120 is a high voltage transistor because the output voltage of the charge pump 106 may be higher than the voltage used with other circuitry within the integrated circuit 102. Because transistor 120 is a high voltage transistor, $V_{Th}$ is about 0.5V when fabricated using 55 nm technology.

When transistor 120 is biased such that $V_{DS}=V_{GS}-V_{Th}$, the transistor is operating at the edge of the saturation region. When transistor 120 is biased such that $V_{DS} \geq V_{GS}-V_{Th}$, the transistor is operating within the saturation region.

The following are limitations for values of $V_1$ and $V_2$. Maximum values for $V_1$ and $V_2$ are as follows. $V_1$ and $V_2$ can be as high as the maximum voltage rating of the pads 150 and 140, respectively. Minimum values for $V_1$ and $V_2$ are as follows. $V_2$ must be at least equal to $V_{Th}$ in order to turn on transistor 120. Therefore, if, in one embodiment, $V_{Th}=0.5V$, then $V_2$ is greater than or equal to 0.5V. Typically, in such one embodiment, $V_2$ is 1.0V to 1.5V. $V_1$ should be greater than or equal to $V_2$. Accordingly, in such one embodiment, $V_1$ is typically greater than or equal to 1.5V. Furthermore, in such one embodiment, $V_1$ is typically chosen to be 2.0V so that transistor 120 operates well within the saturation region.

When transistor 120 operates in strong inversion, the following can be shown.

$$I_{DRAIN} = \text{beta}(V_{GS}-V_{Th})^2 \qquad \text{Equation (1)}$$

The beta is a constant that is dependent on the technology used.

The preceding equation can be rewritten as:

$$V_{GS} = \frac{\sqrt{I_{DRAIN}}}{\sqrt{\text{beta}}} + V_{Th} \qquad \text{Equation (2)}$$

Using Equation (1), consider now $V_{GS1}$ and $V_{GS2}$, whose values are unknown:

$$I_{DRAIN1} = \text{beta}(V_{GS1}-V_{Th})^2 \qquad \text{Equation (3)}$$

$$I_{DRAIN2} = \text{beta}(V_{GS2}-V_{Th})^2 \qquad \text{Equation (4)}$$

Dividing Equation (3) by Equation (4), and rearranging, yields:

$$\frac{\sqrt{I_{DRAIN1}}}{\sqrt{I_{DRAIN2}}} = \frac{(V_{GS1}-V_{Th})}{(V_{GS2}-V_{Th})} \qquad \text{Equation (5)}$$

From the preceding equation, $V_{Th}$ may be isolated, as follows:

$$V_{Th} = \frac{V_{GS2}\sqrt{I_{DRAIN1}} - V_{GS1}\sqrt{I_{DRAIN2}}}{\sqrt{I_{DRAIN1}} - \sqrt{I_{DRAIN2}}} \qquad \text{Equation (6)}$$

Using the preceding equations, the square root of beta can be expressed as:

$$\sqrt{\text{beta}} = \frac{\sqrt{I_{DRAIN1}} - \sqrt{I_{DRAIN2}}}{V_{GS1} - V_{GS2}} \qquad \text{Equation (7)}$$

It follows that, $$V_{GS3} = \frac{\sqrt{I_{DRAIN3}}}{\sqrt{\text{beta}}} + V_{Th} \qquad \text{Equation (8)}$$

Using the preceding equations, the $V_{GS}$ can be expressed as:

$$V_{GS} = \frac{V_{GS1}(\sqrt{I_{DRAIN}} - \sqrt{I_{DRAIN2}}) + V_{GS2}(\sqrt{I_{DRAIN1}} - \sqrt{I_{DRAIN}})}{\sqrt{I_{DRAIN1}} - \sqrt{I_{DRAIN2}}} \qquad \text{Equation (9)}$$

A general $V_{GS}$ may be extrapolated or interpolated using Equation (9).

In one embodiment, transistor 120 operates in strong inversion; however, the testing circuit 100 also functions when the transistor operates in weak inversion or moderate inversion.

The testing circuit 100 and method in accordance with the invention are not limited to testing a packaged integrated circuit 102. The testing circuit 100 and method in accordance with the invention are also applicable to testing an integrated circuit 102 when it is still in a wafer stage.

The testing circuit 100 and method in accordance with the invention measure a voltage that normally exists only within a packaged integrated circuit, in other words, a voltage that is not available at a pin of the packaged integrated circuit. Unlike known testing circuits and methods, the testing circuit 100 and method in accordance with the invention measure such voltage without causing leakage or other problems with ESD structures.

Unlike known testing circuits and methods, the testing circuit and method in accordance with the invention measure with high precision the output voltage of a charge pump that has low output current capacity, e.g., 10 µA, in some embodiments. However, the testing circuit 100 and method in accordance with the invention are not limited to measuring an output voltage of a charge pump that has a low output current capacity. The testing circuit 100 and method in accordance with the invention are also applicable to measuring the output voltage of a charge pump that has high output current capacity and the output voltage of any other type of circuit regardless of output current capacity.

The testing circuit 100 and method in accordance with the invention are not limited to measuring an output voltage of a charge pump. The testing circuit and method in accordance with the invention is also applicable to measuring a voltage at any node of any circuitry within an integrated circuit.

An advantage of the testing circuit 100 is that it occupies a small area. Another advantage of the testing circuit 100 is that, because of the high input impedance of transistor 120, testing circuit does not consume current from the DUT 104. Still another advantage of the testing circuit 100 is that the output voltage of the charge pump 106 is isolated from the pads 140 and 150. Yet another advantage of the testing circuit 100 is that there is no significant current leakage occurring during determination of the output voltage of the charge pump 106.

A low-voltage test pad is a test pad on which a maximum voltage that can appear on it without one of the diodes 141, 142, 151 and 152 conducting is slightly more than the voltage of the power supply of the integrated circuit 102. In one embodiment, if $V_{DD}=3V$, diodes 142 and 152 are selected such that they conduct when the voltage across such diodes reaches approximately 3.5V. In such one embodiment, a low-voltage test pad is typically defined as a test pad on which a maximum voltage that should appear on it is approximately 3.3V. In such one embodiment, a high-voltage test pad is typically defined as a test pad on which a maximum voltage that can safely appear on it is approximately 5V or higher. Advantageously, some embodiments of the testing circuit 100 use low-voltage pads because the relatively high voltage, e.g., 6V, that the charge pump 106 is capable of outputting is not coupled to the pads 140 and 150. Advantageously, the testing circuit 100 uses pads that can also be used for other purposes when not being used with the testing circuit.

In another embodiment (not shown), the integrated circuit 102 includes the charge pump 106 and more than one additional device whose output voltage can be measured. In such embodiment, switch 131 has multiple positions, and the testing logic sequentially couples node 125 to the output terminal 107 of the charge pump 106 and to an output terminal of each of the more than one additional device.

In another embodiment (not shown), switches 131 and 133 are a single switch that has one side coupled to the gate terminal 121 of transistor 120 and another side selectively coupled to one of the DUT 104 and the pad 140. In yet another embodiment (not shown), pad 150 is dedicated for use with only the testing circuit 100, and switch 132 is replaced with a conductor, such that $R_{INT}$ 160 is directly connected to pad 150.

Although the invention has been described with respect to specific conductivity types or polarity of potentials, skilled artisans appreciated that conductivity types and polarities of potentials may be reversed.

Although, in one exemplary embodiment, the testing circuit 100 is disposed on an integrated circuit 102 fabricated using CMOS technology, the testing circuit can also be disposed on an integrated circuit fabricated using other technologies.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a circuit-supporting substrate;
   circuitry under test including a nod, disposed on the circuit supporting substrate;
   a first test pad, disposed on the circuit supporting substrate;
   a second test pad, disposed on the circuit supporting substrate; and
   a testing circuit for determining a voltage at the node, the testing circuit disposed on the circuit supporting substrate, the testing circuit including:
      a transconductance converter device having a control electrode, a first conducting electrode coupleable to the first test pad, and a second conducting electrode coupleable to a terminal of a power supply, and
      one or more switches for selectively coupling the control electrode to one of the node and the second test pad,
   wherein, during a test mode of the integrated circuit, a voltage at the node is related to a current through the first conducting electrode of the transconductance converter device when the control electrode is coupled to the node, when the first conducting electrode is coupled to the first test pad and when a second conducting electrode is coupled to the terminal of a power supply.

2. The integrated circuit of claim 1, wherein the transconductance converter device is a MOSFET.

3. The integrated circuit of claim 2, wherein the first test pad is coupled to a terminal of a power supply to bias the MOSFET such that it operates in a saturation region during the test mode.

4. The integrated circuit of claim 1, wherein the circuitry under test comprises a charge pump having an output terminal coupled to a load, wherein, during operation of the charge pump, an output voltage at the output terminal of the charge pump is higher than an input voltage of the charge pump, and wherein the node is the output terminal of the charge pump.

5. The integrated circuit of claim 4, wherein the testing circuit includes diodes coupled to the first test pad and to the second test pad, and wherein a maximum voltage that appears on the first test pad and on the second test pad without one of the diodes conducting is a lower voltage than the output voltage of the charge pump.

6. The integrated circuit of claim 4, wherein the charge pump is a low output current capacity charge pump.

7. The integrated circuit of claim 6, wherein the output current capacity of the low output current capacity charge pump is less than 10 μA.

8. The integrated circuit of claim 1, wherein the first test pad and the second test pad are low-voltage test pads.

9. The integrated circuit of claim 1, wherein the integrated circuit is coupled to a power supply having a voltage, wherein the testing circuit includes diodes coupled to the first test pad and to the second test pad, and wherein a maximum voltage that can appear on the first test pad and on the second test pad without one of the diodes conducting is approximately the voltage of the power supply.

10. A method with a MOSFET disposed in an integrated circuit for determining a voltage at a node of other circuitry within the integrated circuit, comprising:
    biasing the MOSFET such that it operates in a saturation region;
    applying a first voltage $V_{FIRST}$ to a control electrode of the MOSFET, and measuring a resulting first current $I_1$ through a conducting electrode of the MOSFET;
    applying a second voltage $V_{SECOND}$ to the control electrode of the MOSFET, and measuring a resulting second current $I_2$ through the conducting electrode of the MOSFET;
    coupling the node of the other circuitry to the control electrode of the MOSFET, and measuring a resulting third current $I_3$ through the conducting electrode of the MOSFET; and
    determining the voltage at the node of the other circuitry from $V_{FIRST}$, $V_{SECOND}$, $I_1$ and $I_2$.

11. The method of claim 10, wherein the step of determining includes calculating $$V_{THIRD} = \frac{V_{FIRST}(\sqrt{I_3} - \sqrt{I_2}) + V_{SECOND}(\sqrt{I_1} - \sqrt{I_3})}{\sqrt{I_1} - \sqrt{I_2}},$$

where $V_{THIRD}$ has a same value as the voltage at the node of the other circuitry.

12. The method of claim 10, wherein, prior to the step of biasing, a first conducting electrode of the MOSFET is coupled to a first test pad, and a second conducting electrode of the MOSFET is coupled to a terminal at ground potential, and wherein a bias voltage of the MOSFET is applied to the first test pad.

13. The method of claim 12, wherein the bias voltage that is applied to the first test pad is from a first voltage source external to the integrated circuit.

14. The method of claim 13, wherein the currents $I_1$, $I_2$ and $I_3$ are measured by a current meter external to the integrated circuit and coupled to the first test pad.

15. The method of claim 10, wherein the control electrode of the MOSFET is selectively coupled to one of: the node of the other circuitry, and a second test pad.

16. The method of claim 15, wherein, prior to the step of applying, the control electrode of the MOSFET is coupled to the second test pad, and the step of applying includes applying one or more voltages to the second test pad while the control electrode of the MOSFET is coupled to the second test pad.

17. The method of claim 16, wherein the one or more voltages are applied to the second test pad from a second voltage source external to the integrated circuit.

18. An integrated circuit, comprising:
a circuit-supporting substrate;
a charge pump for outputting an output voltage at an output terminal thereof, disposed on the circuit supporting substrate;
a load, coupled to the output terminal of the charge pump, disposed on the circuit supporting substrate;
a first test pad, disposed on the circuit supporting substrate;
a second test pad, disposed on the circuit supporting substrate; and
a testing circuit selectively coupled to the output terminal of the charge pump only during a test mode of the integrated circuit, the testing circuit for determining the output voltage of the charge pump, the testing circuit disposed on the circuit supporting substrate, the testing circuit including:
a MOSFET having a gate terminal, a first conducting electrode coupled to the first test pad, and a second conducting electrode coupled to a terminal of a power supply, and
one or more switches for selectively coupling the gate terminal of the MOSFET to one of the output terminal and the second test pad,
wherein, during the test mode, a voltage at the output terminal of the charge pump is related to a current through the first conducting electrode of the MOSFET when the gate terminal of the MOSFET is coupled to the output terminal.

19. The integrated circuit of claim 18, wherein the MOSFET has a channel length that is much greater than a channel width.

20. The integrated circuit of claim 18, wherein the current through the first conducting electrode of the MOSFET is less than 100 µA.

* * * * *

UNITED STATES PATENT AND TRADEMARK OFFICE
CERTIFICATE OF CORRECTION

Page 1 of 1

PATENT NO. : 8,935,117 B2
APPLICATION NO. : 13/416892
DATED : January 13, 2015
INVENTOR(S) : Walter Luis Tercariol et al.

It is certified that error appears in the above-identified patent and that said Letters Patent is hereby corrected as shown below:

In the Claims

Col. 9, in claim 1, line 51:

change "nod" to --node--.

Signed and Sealed this
Twenty-eighth Day of April, 2015

Michelle K. Lee
*Director of the United States Patent and Trademark Office*